(12) United States Patent
Sowlati

(10) Patent No.: US 6,498,533 B1
(45) Date of Patent: Dec. 24, 2002

(54) BOOTSTRAPPED DUAL-GATE CLASS E AMPLIFIER CIRCUIT

(75) Inventor: Tirdad Sowlati, Ossining, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 77 days.

(21) Appl. No.: 09/671,911

(22) Filed: Sep. 28, 2000

(51) Int. Cl.[7] .............................. H03F 1/22; H03F 3/217
(52) U.S. Cl. ........................ 330/98; 330/251; 330/311
(58) Field of Search .......................... 330/98, 99, 100, 330/110, 251, 277, 290, 302, 311

(56) References Cited

U.S. PATENT DOCUMENTS

| | | | |
|---|---|---|---|
| 3,268,827 A | 8/1966 | Carlson et al. ................ 330/18 |
| 4,100,438 A | 7/1978 | Yokoyama ................... 307/304 |
| 4,284,905 A | 8/1981 | Rosenzweig ................. 307/482 |
| 4,317,055 A | 2/1982 | Yoshida et al. .............. 307/304 |
| 5,045,808 A | * 9/1991 | Taylor ..................... 330/311 X |
| 5,068,623 A | * 11/1991 | Camin et al. ............ 330/311 X |
| 5,821,814 A | * 10/1998 | Katayama et al. ........... 330/277 |
| 6,204,728 B1 | * 3/2001 | Hageraats ..................... 330/98 |

* cited by examiner

*Primary Examiner*—Steven J. Mottola
(74) *Attorney, Agent, or Firm*—Steven B. Biren

(57) ABSTRACT

A bootstrapped dual-gate Class E amplifier circuit includes a first MOSFET and a second MOSFET connected in series and coupled between a dc voltage source terminal and a common terminal. An rf input signal terminal is coupled to a gate electrode of the first MOSFET and a dc control voltage terminal is coupled to a gate electrode of the second MOSFET, with a unidirectionally-conducting element such as a diode-connected MOSFET being coupled between a drain electrode and the gate electrode of the second MOSFET. The output of the amplifier circuit is taken from the drain electrode of the second MOSFET. This circuit configuration permits the first and second MOSFETs to withstand a larger output voltage swing, thus permitting the use of a higher supply voltage and resulting in a substantially increased maximum output power capability for a given load value.

7 Claims, 1 Drawing Sheet

BOOTSTRAPPED DUAL-GATE CLASS E AMPLIFIER CIRCUIT

BACKGROUND OF THE INVENTION

The invention is in the field of transistor amplifier circuits, and relates more particularly to power amplifier circuits suitable for use in high-frequency applications.

One type of amplifier circuit used in high-frequency applications is the Class E power amplifier, in which the active component is used as a switch which turns on and off at the carrier frequency. Class E power amplifiers have been used in wireless communications apparatus and have been designed in both GaAs MESFET and deep-submicron CMOS technology.

In Class E power amplifiers, the signal swing at the drain of the output transistor can typically be three or more times the power supply voltage. This imposes a limitation on the maximum supply voltage that can be used to avoid gate-drain breakdown in MOS transistors. Thus, for example, in a 0.25 micron CMOS process, the nominal supply voltage is 2.5 volts. However, a 2.5 volt Class E amplifier cannot be designed in this process, as the gate breakdown voltage is 6 volts. Taking into account the signal swing at the gate, which is in opposite phase to the signal swing at the drain, conventional techniques limit the maximum allowable power supply voltage in Class E in this process to 1.5 volts. Since the output power in Class E operation is proportional to the square of the power supply voltage, using 1.5 volts instead of 2.5 volts reduces the maximum power output by a factor of 2.7 for a given load value.

Although various prior-art techniques exist for improving circuit performance using series-connected transistors and bootstrapping techniques, as shown in U.S. Pat. Nos. 3,268,827; 4,100,438; 4,284,905; and 4,317,055, these references do not address the issue of how to maximize usable power supply voltage in a Class E amplifier circuit. Accordingly, it would be desirable to have a Class E amplifier circuit in which power output is not limited by operating the output stage at less than the nominal supply voltage due to component breakdown restraints.

SUMMARY OF THE INVENTION

It is therefore an object of the invention to provide a Class E amplifier circuit in which the useable power supply voltage is maximized, so that power output is not limited by voltage constraints imposed by component breakdown characteristics.

In accordance with the invention, this object is achieved by a new Class E amplifier circuit in a bootstrapped dual-gate configuration in which a first MOSFET and a second MOSFET are connected in series and coupled between a dc voltage source terminal and a common terminal, with an rf input signal terminal being coupled to a gate electrode of the first MOSFET and a dc control voltage terminal being coupled to a gate electrode of the second MOSFET. In order to provide a bootstrapping effect, a unidirectionally-conducting element is coupled between a drain electrode and the gate electrode of the second MOSFET, and an output of the amplifier circuit is taken from the drain electrode of the second MOSFET.

In a preferred embodiment of the invention, the dc control voltage source terminal is coupled to the gate electrode of the second MOSFET by a resistor, and the rf input signal terminal is coupled to the gate electrode of the first MOSFET by a capacitor.

In a further preferred embodiment of the invention, the unidirectionally-conducting element is a diode-connected MOSFET, which implements the bootstrapping effect.

A bootstrapped dual-gate Class E amplifier circuit in accordance with the present invention offers a significant improvement over prior-art Class E amplifiers in that the useable power supply voltage is maximized to achieve substantially increased power output.

These and other aspects of the invention will be apparent from and elucidated with reference to the embodiments described hereinafter.

BRIEF DESCRIPTION OF THE DRAWING

The invention may be more completely understood with reference to the following description, to be read in conjunction with the accompanying drawing, in which the single FIGURE. shows a simplified schematic diagram of a bootstrapped dual-gate Class E amplifier circuit in accordance with the invention.

DESCRIPTION OF THE PREFERRED EMBODIMENTS

Figure 1:
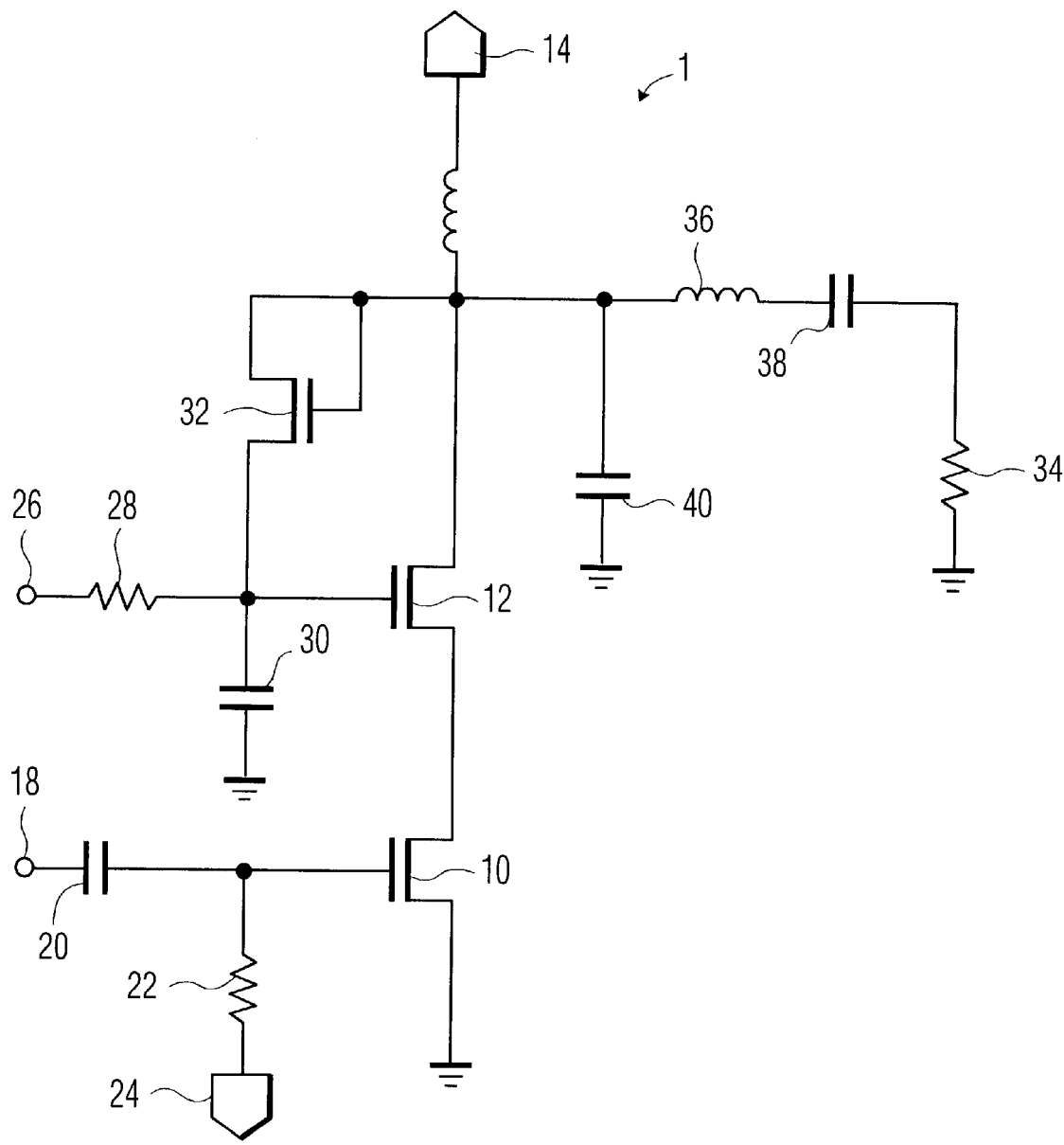

A simplified schematic diagram of a bootstrapped dual-gate Class E amplifier circuit 1 in accordance with the invention is shown in the FIGURE. The amplifier circuit includes a first MOSFET having its main current path connected in series with the main current path of a second MOSFET 12, with the series-connected pair coupled between a dc voltage source terminal 14 and a common terminal (ground) by an inductor 16 connected to terminal 14.

An rf input signal terminal 18 is coupled to a gate electrode of MOSFET 10 by a coupling capacitor 20, and a dc bias voltage is provided to the gate of MOSFET 10 by a resistor 22 connected to a source of bias voltage 24.

The gate of MOSFET 12 is coupled to a dc control voltage terminal 26 by a resistor 28, and the gate of MOSFET 12 is also coupled to ground by a capacitor 30. Additionally, the gate and drain of MOSFET 12 are coupled by a unidirectionally-conducting element, here a diode-connected MOSFET 32, that conducts when the drain voltage is greater than the gate voltage. This diode-connected MOSFET provides a bootstrapping effect in a manner which will be described hereinafter. Component 32 may alternatively be a pn diode.

The output of the active portion of the amplifier circuit, taken from the drain of MOSFET 12, is coupled to a load shown symbolically by resistor 34 through a matching circuit comprising a series connection of an inductor 36 and capacitor 38, with a capacitor 40 being provided between the drain of MOSFET 12 and ground.

As noted above, conventional Class E operation imposes certain unique limitations on the maximum supply voltage that can be used to avoid gate-drain breakdown, thus substantially reducing the maximum available output power. This problem can be partially overcome by using a simple dual-gate MOSFET switch (i.e. two transistors having their main current paths connected in series). This configuration permits the power supply voltage to be increased by about 30%, which translates into an increase in output power by a factor of about 1.69.

A substantial further improvement in output power may be achieved by utilizing a bootstrapped dual-gate Class E amplifier circuit as shown in the FIGURE. This improvement is obtained by coupling a unidirectionally-conducting element, here diode-connected MOSFET 32, between the drain electrode and gate electrode of MOSFET 12 in order to simply and efficiently achieve the desired bootstrapping effect. When the signal at the gate of MOSFET 10 is high, transistors 10 and 12 will be on, and the voltage at the drain of transistor 12 will be low. Accordingly, element 32 will be nonconducting, and will play no role in circuit operation. When the voltage at the gate of MOSFET 10 goes low, MOSFET 10 will be off, and the voltage at the drain of MOSFET 12 will start to increase. Once this voltage rises above the dc voltage applied to the gate of MOSFET 12 plus the threshold voltage of the diode-connected MOSFET 32, component 32 will begin conducting, and will cause the voltage at the gate of MOSFET 12 to increase, following the increase in the voltage at the drain. By appropriately selecting the value of components 28 and 30, as well as the geometry of component 32, the drain-gate voltage of MOSFET 12 can be appropriately controlled. Since the voltage at the gate of MOSFET 12 controls its source voltage, and the source of MOSFET 12 is connected to the drain of MOSFET 10, the gate-drain voltage of MOSFET 10 can also be controlled.

It has been found that optimum breakdown capability is obtained when components 10 and 12 receive substantially the same maximum drain-gate voltage, as this permits use of the largest possible supply voltage for a given transistor design without either transistor breaking down. By appropriately selecting parameters for components 28, 30 and 32, as discussed above, to achieve this condition, the Class E amplifier circuit of the invention can be operated with approximately twice the supply voltage of a conventional Class E amplifier circuit, thus increasing output power by a factor of about 4 for a given load value.

In this manner, the present invention provides a bootstrap dual-gate Class E amplifier circuit in which the useable power supply voltage can be maximized, so that power output is not limited by the need to operate the output stage at a lower voltage than the nominal supply voltage in order to avoid component breakdown. Additionally, the improvement achieved by the invention can be implemented in a simple and economical circuit configuration.

While the invention has been particularly shown and described with reference to a preferred embodiment thereof, it will be understood by those skilled in the art that various changes in form and detail may be made without departing from the spirit or scope of the invention. Thus, for example, the invention may be applied to GaAs MESFET or GaAs PHEMT technology as well as CMOS technology. Additionally, different types of transistors or other components may be employed, and alterations to the circuit configuration may be made to suit particular design requirements.

What is claimed is:

1. A bootstrapped dual-gate amplifier circuit comprising a first MOSFET and a second MOSFET connected in series and coupled between a dc voltage source terminal and a common terminal, an rf input signal terminal being coupled to a gate electrode of said first MOSFET and a dc control voltage terminal being coupled to a gate electrode of said second MOSFET, bootstrapping means comprising a unidirectionally-conducting feedback element being coupled between a drain electrode and said gate electrode of said second MOSFET, said amplifier being operable as a Class E amplifier, and an output of said amplifier circuit being taken from said drain electrode.

2. A bootstrapped dual-gate Class E amplifier circuit as in claim 1, wherein a drain electrode of said second MOSFET is coupled to said dc voltage source terminal by an inductor and a source electrode of said first MOSFET is connected to said common terminal.

3. A bootstrapped dual-gate Class E amplifier circuit as in claim 2, wherein the output of said amplifier circuit is coupled to a load by a matching circuit.

4. A bootstrapped dual-gate Class E amplifier as in claim 3, wherein said matching circuit comprises a capacitor connected between said drain electrode of said second transistor and said common terminal.

5. A bootstrapped dual-gate Class E amplifier circuit as in claim 4, wherein said matching circuit further comprises a capacitor and an inductor coupled between the output of said amplifier circuit and the load.

6. A bootstrapped dual-gate Class E amplifier circuit as in claim 1, wherein said dc control voltage source terminal is coupled to said gate electrode of the second MOSFET by a resistor and said rf input signal terminal is coupled to the gate electrode of the first MOSFET by a capacitor.

7. A bootstrapped dual-gate Class E amplifier circuit as in claim 1, wherein said unidirectionally-conducting element comprises a diode-connected MOSFET.

* * * * *